United States Patent
Yamazaki

(10) Patent No.: US 9,302,671 B2
(45) Date of Patent: Apr. 5, 2016

(54) CONTROL DEVICE FOR VEHICLE AND METHOD OF CONTROLLING VEHICLE

(71) Applicant: NISSAN MOTOR CO., LTD., Yokohama-shi, Kanagawa (JP)

(72) Inventor: Takehiko Yamazaki, Chigasaki (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/416,218

(22) PCT Filed: Jun. 11, 2013

(86) PCT No.: PCT/JP2013/066114
§ 371 (c)(1),
(2) Date: Jan. 21, 2015

(87) PCT Pub. No.: WO2014/017198
PCT Pub. Date: Jan. 30, 2014

(65) Prior Publication Data
US 2015/0210271 A1    Jul. 30, 2015

(30) Foreign Application Priority Data
Jul. 27, 2012    (JP) .................. 2012-167009

(51) Int. Cl.
*B60W 20/00*    (2006.01)
*B60K 6/485*    (2007.10)
(Continued)

(52) U.S. Cl.
CPC ............... *B60W 20/50* (2013.01); *B60K 6/485* (2013.01); *B60K 6/543* (2013.01); *B60L 1/00* (2013.01);
(Continued)

(58) Field of Classification Search
CPC ..... B60W 20/50; B60W 10/26; B60W 10/08; B60W 30/18127; B60W 20/00; B60L 11/02; B60L 3/00; B60L 3/0092; B60L 1/00; B60L 3/04; B60L 11/1864; B60L 2250/10; Y10S 903/93; H02J 7/0021; G01R 31/3278; G01R 31/006; F02N 11/0866; F02N 11/04; F02N 11/087; F02N 2250/02; F02N 11/0814; F02N 11/108; B60K 6/543; B60K 6/485; F02D 2041/227
See application file for complete search history.

(56) References Cited

U.S. PATENT DOCUMENTS 6,757,599 B2    6/2004    Nada
2001/0048226 A1    12/2001    Nada
(Continued)

FOREIGN PATENT DOCUMENTS

JP    09-287513 A    11/1997
JP    2001-317399 A    11/2001
(Continued)

OTHER PUBLICATIONS

U.S. Appl. No. 14/416,512, filed Jan. 22, 2015, Nissan Motor Co., Ltd.
(Continued)

*Primary Examiner* — Rodney Butler
(74) *Attorney, Agent, or Firm* — Foley & Lardner LLP

(57) ABSTRACT

A control device for a vehicle includes a relay adapted to switch whether a first battery electrically connected to a motor generator and a second battery electrically connected to an electric load of the vehicle are to be electrically connected or not by turning on/off the relay. The relay is turned off during a power operation of the motor generator to disconnect an electric connection between the first battery and the second battery. The relay is turned on during a regenerative operation of the motor generator to electrically connect the first battery and the second battery. In a case where an on-fixation failure of the relay is detected, the power operation of the motor generator is prohibited.

6 Claims, 6 Drawing Sheets

(51) Int. Cl.

| | |
|---|---|
| *B60K 6/543* | (2007.10) |
| *B60W 10/08* | (2006.01) |
| *B60W 10/26* | (2006.01) |
| *F02N 11/04* | (2006.01) |
| *F02N 11/08* | (2006.01) |
| *B60L 11/18* | (2006.01) |
| *G01R 31/327* | (2006.01) |
| *H02J 7/00* | (2006.01) |
| *B60W 30/18* | (2012.01) |
| *B60L 11/02* | (2006.01) |
| *B60L 1/00* | (2006.01) |
| *B60L 3/00* | (2006.01) |
| *B60L 3/04* | (2006.01) |
| *F02N 11/10* | (2006.01) |
| *G01R 31/00* | (2006.01) |
| *F02D 41/22* | (2006.01) |

(52) U.S. Cl.
CPC ............... *B60L 3/00* (2013.01); *B60L 3/0092* (2013.01); *B60L 3/04* (2013.01); *B60L 11/02* (2013.01); *B60L 11/1864* (2013.01); *B60W 10/08* (2013.01); *B60W 10/26* (2013.01); *B60W 20/00* (2013.01); *B60W 30/18127* (2013.01); *F02N 11/04* (2013.01); *F02N 11/087* (2013.01); *F02N 11/0866* (2013.01); *G01R 31/3278* (2013.01); *H02J 7/0021* (2013.01); *B60L 2250/10* (2013.01); *F02D 2041/227* (2013.01); *F02N 11/0814* (2013.01); *F02N 11/108* (2013.01); *F02N 2250/02* (2013.01); *G01R 31/006* (2013.01); *Y10S 903/93* (2013.01)

(56) References Cited

U.S. PATENT DOCUMENTS

| | | | |
|---|---|---|---|
| 2003/0158639 | A1 | 8/2003 | Nada |
| 2005/0061574 | A1 | 3/2005 | Torizawa |
| 2005/0082095 | A1 | 4/2005 | Tamai et al. |
| 2005/0269981 | A1 | 12/2005 | Sakurai |
| 2006/0097577 | A1 | 5/2006 | Kato et al. |
| 2010/0123989 | A1* | 5/2010 | Kosaki et al. ............. 361/93.9 |
| 2012/0049771 | A1* | 3/2012 | Komatsu ..................... 318/139 |
| 2012/0191294 | A1 | 7/2012 | Boiron et al. |
| 2013/0106180 | A1 | 5/2013 | Akimasa et al. |

FOREIGN PATENT DOCUMENTS

| | | | |
|---|---|---|---|
| JP | 2004032903 A | * | 1/2004 |
| JP | 2004-328988 A | | 11/2004 |
| JP | 2007-120960 A | | 5/2007 |
| JP | 2007-318849 A | | 12/2007 |
| JP | 2007-329045 A | | 12/2007 |
| JP | 2008-82275 A | | 4/2008 |
| JP | 2009-171769 A | | 7/2009 |
| JP | 2009-266494 A | | 11/2009 |
| JP | 2010-154594 A | | 7/2010 |
| JP | 2011-004556 A | | 1/2011 |
| JP | 2011-087408 A | | 4/2011 |
| JP | 2012-025201 A | | 2/2012 |
| WO | WO 2004071814 A1 | * | 8/2004 |
| WO | WO-2011/010026 A1 | | 1/2011 |
| WO | WO-2012/008124 A1 | | 1/2012 |

OTHER PUBLICATIONS

USPTO Office Action, U.S. Appl. No. 14/416,512, Sep. 9, 2015, 17 pages.
USPTO Notice of Allowance, U.S. Appl. No. 14/416,512, Jan. 21, 2016.

* cited by examiner

CONTROL DEVICE FOR VEHICLE AND METHOD OF CONTROLLING VEHICLE

TECHNICAL FIELD

The present invention relates a control device for a vehicle and a method of controlling a vehicle.

BACKGROUND ART

Heretofore, in a control device for a vehicle capable of automatic stop/automatic restart, a technology in which a main battery electrically connected to a starter, a sub battery electrically connected to an electric load of the vehicle, and a relay capable of switching whether the main battery and the sub battery are to be electrically connected or not by turning on/off the relay are provided and the starter is operated by turning off the relay at the time of restart after automatic stop of an engine (see JP2008-82275A). As a result, at the time of operating the starter, it is possible to prevent a voltage drop (instantaneous voltage drop) of the sub battery from occurring, and this makes it possible to prevent power supply shortage to the electric load.

SUMMARY OF INVENTION

However, in the control device for the vehicle described above, in a case where an on-fixation failure in which the relay between the main battery and the sub battery is kept to be on occurs, a following problem is caused. Namely, even if a command to turn off the relay is outputted at the time of restart after automatic stop of the engine, the starter is operated while the relay is still in the on state. For this reason, there is a possibility that a voltage drop of the sub battery occurs and power supply shortage to the electric load thereby occurs.

It is an object of the present invention to prevent the voltage drop of the sub battery in a case where an on-fixation failure occurs in the relay between the main battery and the sub battery occurs.

A control device for a vehicle according to one embodiment includes: a motor generator mechanically connected to an output shaft of an engine; a first battery electrically connected to the motor generator; a second battery electrically connected to an electric load of the vehicle; a relay adapted to switch whether the first battery and the second battery are to be electrically connected or not by turning the relay on or off; a motor generator control unit adapted to cause the motor generator to carry out a power operation or a regenerative operation of in accordance with an operation state of the vehicle; a relay control unit adapted to turn off the relay during the power operation of the motor generator so as to disconnect an electric connection between the first battery and the second battery, the relay control unit also adapted to turn on the relay during the regenerative operation of the motor generator so as to electrically connect the first battery and the second battery; and an on-fixation failure detecting unit adapted to detect an on-fixation failure in which the relay is fixed in an on state. The motor generator control unit prohibits the power operation of the motor generator in a case where the on-fixation failure of the relay is detected.

Embodiments of the present invention and advantages of the present invention will be described below in detail with reference to the appending drawings.

DESCRIPTION OF EMBODIMENTS

Figure 1:
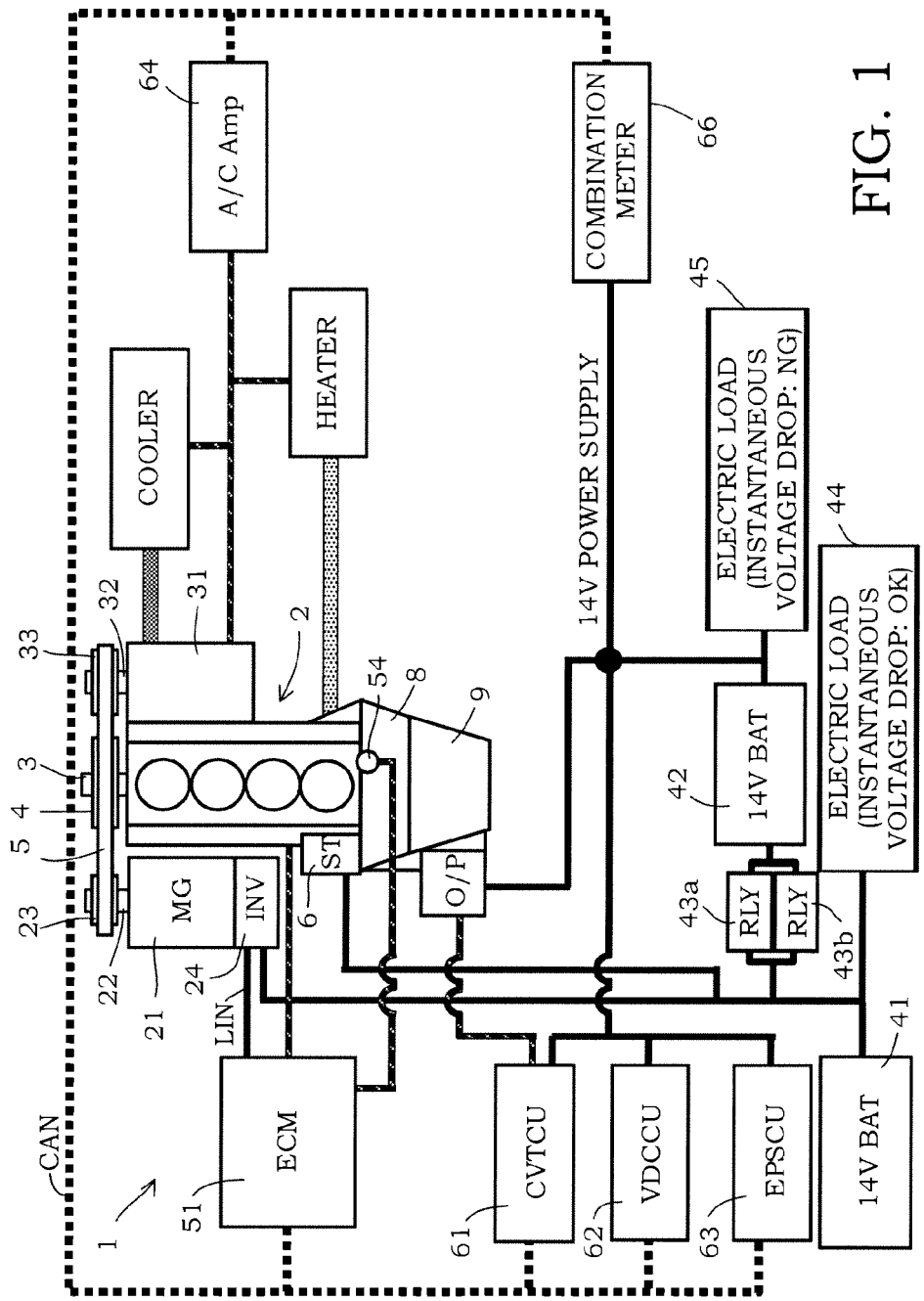
FIG. 1 is a schematic configuration diagram of a control device for a vehicle according to one embodiment.

FIG. 1 is a schematic configuration diagram of a control device for a vehicle according to one embodiment. In FIG. 1, an engine 2, a motor generator 21 and an air-conditioner compressor 31 are provided on a vehicle 1. Specifically, an output shaft 3 of the engine 2, a rotating shaft 22 of the motor generator 21, and a rotating shaft 32 of the air-conditioner compressor 31 are arranged in parallel. A crank pulley 4 is mounted on one end of the output shaft 3, and pulleys 23 and 33 are mounted on the rotating shafts 22 and 32, respectively. A belt 5 is wound around each of these three pulleys 4, 23, and 33, and power is transmitted (conducted) by the belt 5 among the output shaft 3 of the engine 2 and the rotating shafts 22, 32.

A starter 6 is used for start of the engine 2. A torque converter 8 and a belt-type automatic transmission 9 are connected to the other end of the output shaft 3 of the engine 2. The torque converter 8 has a pump impeller and a turbine runner, which are not shown in the drawings. The belt-type automatic transmission 9 has a primary pulley, a secondary pulley, and a steel belt wound around these pulleys, which are not shown in the drawings. A rotary driving force of the engine 2 is finally transmitted to driving wheels of the vehicle (not shown in the drawings) via the torque converter 8 and the automatic transmission 9.

A main battery 41 and a sub battery 42 are provided as a power source of the vehicle 1. Both the batteries are 14V batteries. Two relays 43a and 43b arranged in parallel are connected between the two batteries 41 and 42. Providing the two relays 43a and 43b is because of backup in a case where one of the relays fails and because the number of times of durable operations of the relay is extended as compared with a case in which only one relay is provided.

The starter 6 and the motor generator 21 described above are connected between the main battery 41 and the relays 43a and 43b, and power is supplied from the main battery 41. In this regard, since the motor generator 21 is constituted by an AC machine, an inverter 24 for converting a DC from the main battery 41 into an AC is attached.

An electric load 44 is a load whose own operation is not affected by instantaneous voltage drop in which a voltage of the battery instantaneously drops, and power is supplied from the main battery 41. On the other hand, an electric load 45 is a load whose own operation is affected by the instantaneous voltage drop, and power is supplied from the sub battery 42.

An engine control module (ECM) or a controller 51 controls the engine 2, the starter 6, the motor generator 21, and the relays 43a and 43b. For example, the engine control module 51 causes the motor generator 21 to carry out power operation or regenerative operation in accordance with an operation state of the vehicle. Further, the engine control module 51 turns off the relays 43a and 43b during the power operation of the motor generator 21 to disconnect electric connection between the main battery 41 and the sub battery 42. The engine control module 51 turns on the relay 43a or 43b during the regenerative operation of the motor generator 21 to electrically connect the main battery 41 and the sub battery 42.

Figure 2:
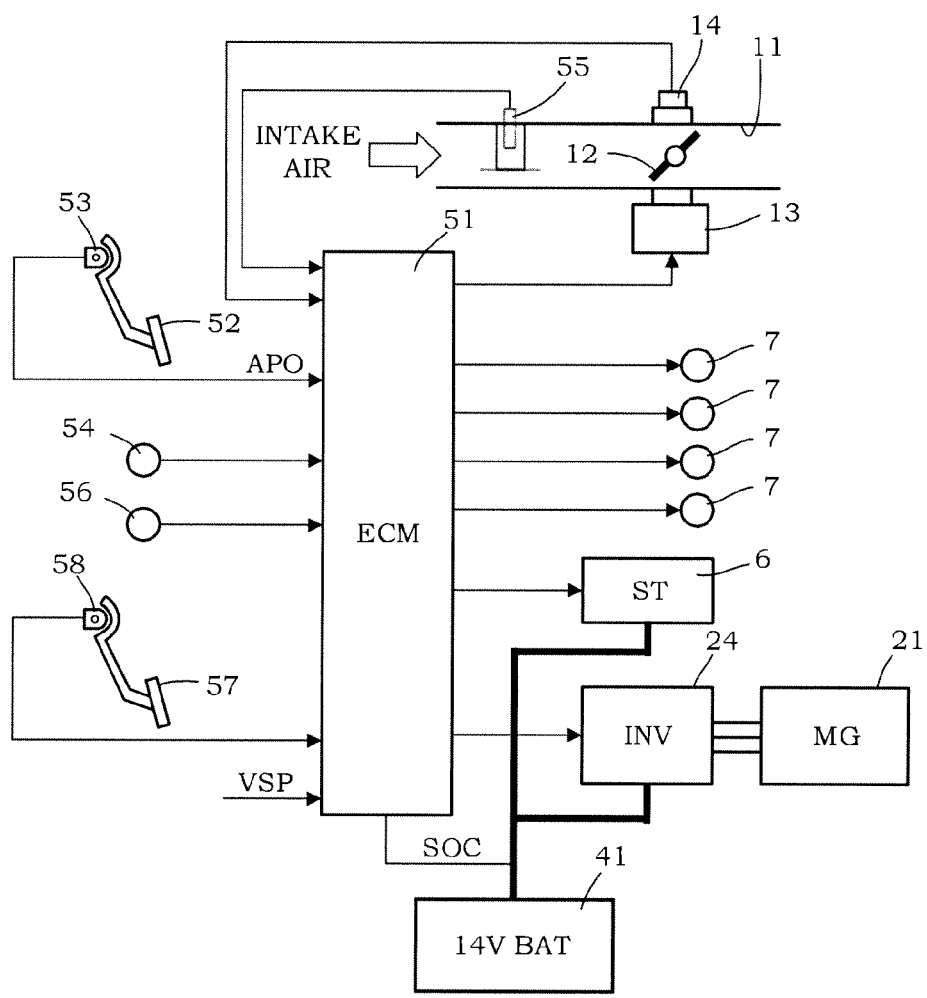
FIG. 2 is a control system diagram of a gasoline engine.

FIG. 2 is a control system diagram of a gasoline engine. A fuel injection valve 7 is provided at each of intake ports (not shown in the drawings). The fuel injection valve 7 intermittently supplies fuel to the engine 2.

An electronically controlled throttle valve 12 is provided on an intake passage 11, and an opening degree of the throttle valve 12 (hereinafter, referred to as a "throttle opening degree") is controlled by a throttle motor 13. An actual throttle opening degree is detected by a throttle sensor 14, and is inputted into the engine control module 51.

A signal of an accelerator opening degree (a stepping amount of an accelerator pedal 52) from an accelerator sensor 53, a signal of a crank angle from a crank angle sensor 54, and a signal of an intake air amount from an airflow meter 55 are inputted into the engine control module 51. A rotation speed of the engine 2 is calculated from the signal of the crank angle sensor 54. The engine control module 51 calculates a target intake air amount and a target fuel injection amount on the basis of these signals, and respectively outputs commands to the throttle motor 13 and each of the fuel injection valves 7 so that the target intake air amount and the target fuel injection amount can be obtained.

Here, a control of the intake air amount will be summarized (see JP9-287513A). By searching a predetermined map from an accelerator opening degree APO and an engine rotation speed Ne, each of a target basic intake air amount and a target equivalent ratio tDML is calculated. A value obtained by dividing the target basic intake air amount by the target equivalent ratio tDML is set to the target intake air amount. Then, by searching a predetermined map from the target intake air amount and the engine rotation speed, a target throttle valve opening degree is acquired. The target throttle valve opening degree is converted into a command value to output the command value to the throttle motor 13.

Next, a control of fuel injection (including a fuel injection amount and fuel injection timing) will be summarized. An output of the airflow meter 55 is A/D converted and linearized to calculate an intake air amount Qa. A basic injection pulse width Tp0 [ms] by which a mixture with a substantially theoretical air fuel ratio (i.e., the equivalent ratio=1.0) can be obtained is acquired from the intake air amount Qa and the engine rotation speed Ne using $Tp0=K \times Qa/Ne$ (where K is a constant). Subsequently, a cylinder air amount equivalent pulse width Tp [ms] is acquired by the following formula:

$$Tp = Tp0 \times \text{Fload} + Tp-1 \times (1-\text{Fload})$$

where Fload: weighted average coefficient;
Tp−1: Tp previous time.
Since an amount of air flowing into a cylinder (combustion chamber), that is, a cylinder air amount inheres a response delay with respect to the intake air amount in an airflow meter portion, this response delay is approximated by a primary delay in the formula described above. The weighted average coefficient Fload [absolute number] that is a coefficient of the primary delay is acquired by searching a predetermined map from a product Ne×V of the rotation speed Ne and a cylinder volume V and a total passage area Aa of an intake pipe. On the basis of the cylinder air amount equivalent pulse width Tp acquired in this manner, a fuel injection pulse width Ti [ms] to be given to the fuel injection valves 7 is calculated by the following formula:

$$Ti = Tp \times tDML \times (\alpha + \alpha m - 1) \times 2 + Ts$$

where
tDML: target equivalent ratio [absolute number];
α: air fuel ratio feedback correction coefficient [absolute number];
αm: air fuel ratio learning value [absolute number];
Ts: ineffective injection pulse width [absolute number].
Then, at predetermined fuel injection timing, the fuel injection valve 7 is opened for a period of this fuel injection pulse width Ti.

In this regard, the gasoline engine 2 is provided with an ignition plug by facing the combustion chamber (cylinder). The engine control module 51 causes the ignition plug to generate a spark by shutting off an electric current on a primary side of an ignition coil at predetermined timing before a compression top dead center, whereby the mixture in the combustion chamber is ignited.

Further, when the engine control module 51 determines that there is an initial start request on the basis of a signal from a starter switch 56, the engine control module 51 drives the starter 6 to start up the engine 2.

The engine control module 51 carries out an idle stop control with the purpose of improvement of fuel efficiency. Namely, when the accelerator pedal 52 has not been stepped (APO=0), a brake pedal 57 has been stepped (brake switch 58 is turned ON), and the vehicle 1 is in a stop state (vehicle speed VSP=0), an idle stop permission condition is satisfied. When the idle stop permission condition is satisfied, fuel injection from the fuel injection valve 7 to the intake port is shut off, and the engine 2 is stopped. As a result, wasteful fuel consumption is reduced.

Then, in a case where the accelerator pedal 52 is stepped or the brake pedal 57 is returned (the brake switch 58 is turned OFF) in the idle stop state, the idle stop permission condition is not satisfied. In a case where the idle stop permission condition is not satisfied, the engine 2 is subjected to cranking using the motor generator 21 as a starter, and fuel injection from the fuel injection valve 7 and spark ignition by the ignition plug are resumed to restart the engine 2.

By exclusively using the motor generator 21 for restart of the engine from the idle stop in this manner, a use frequency of the starter 6 is reduced, and the starter 6 is thus protected. In this regard, when the starter 6 or the motor generator 21 is to be driven, the engine control module 51 shuts off both the two relays 43a and 43b to electrically disconnect the main battery 41 and the sub battery 42. As a result, it is possible to prevent a voltage of the sub battery 42 from fluctuating with a start operation of the engine 2 is.

Returning to FIG. 1, the explanation will be continued. An automatic transmission control unit (CVTCU) 61 is provided in the vehicle 1. The automatic transmission control unit 61 steplessly controls a gear ratio of the automatic transmission 9 in accordance with a traveling condition of the vehicle determined by the vehicle speed and the throttle opening degree. Further, a mechanical lockup clutch for engaging or disengaging the pump impeller and the turbine runner is provided in the torque converter 8 having the pump impeller and the turbine runner. A traveling region of the vehicle in which the lockup clutch is engaged is determined in advance as a lockup region (having the vehicle speed and the throttle opening degree as parameters). When the traveling condition of the vehicle becomes the lockup region, the automatic transmission control unit 61 engages the lockup clutch to bring the engine 2 and the transmission 9 into a directly connected state. When the traveling condition of the vehicle is not in the lockup region, the automatic transmission control unit 61 disengages the lockup clutch. When the engine 2 and the transmission 9 are brought into the directly connected state, torque is not absorbed by the torque converter 8, and fuel efficiency is improved to that extent.

A vehicle dynamic control (Vehicle Dynamics Control) unit (VDCCU) 62, a vehicle-speed sensitive electric power steering (Electric Power Steering) control unit (EPSCU) 63, an air-conditioner auto amp 64, and a combination meter 66 are also provided in the vehicle 1. In the vehicle dynamic control unit 62, when the vehicle almost laterally sides or swings a tail thereof, a laterally siding state is detected by a sensor, and vehicle stability during traveling is improved by means of a brake control and an engine output control. The vehicle-speed sensitive electric power steering control unit 63 outputs an optimal assist torque signal to an EPS motor on the basis of a steering torque inputted from the torque sensor and the vehicle speed.

The automatic transmission control unit 61, the vehicle dynamic control unit 62, the vehicle-speed sensitive power steering control unit 63, and the combination meter 66 described above are electric loads that cannot allow a voltage drop. Therefore, they are supplied with power from the sub battery 42.

The engine control module 51 and the three control units 61 to 63, the air-conditioner auto amp (A/C amp) 64, and the combination meter 66 are connected to each other by a CAN (Controller Area Network). A vehicle speed signal is inputted into the engine control module 51 from the combination meter 66.

The motor generator 21 is used not only for restart of the engine from the idle stop but also for torque assist during traveling of the vehicle. When the torque assist is allowed, the main battery 41 is used as a power source so as to assist a torque of the engine 2 to cause the motor generator 21 to generate a predetermined assist torque. When the torque assist is prohibited, the motor generator 21 is caused not to generate an assist torque. As a result, it is possible to obtain good acceleration responsiveness (drivability) after start of the engine 2 and after start of the traveling of the vehicle 1.

The inverter 24 and the engine control module 51 are connected to each other by a LIN (Local Interconnect Network). The engine control module 51 instructs, via the LIN, to the inverter 24 whether the motor generator 21 is driven or electric power is generated by the motor generator 21, how much a current is caused to flow for driving the motor generator 21 as a motor, or the like.

Figure 3:
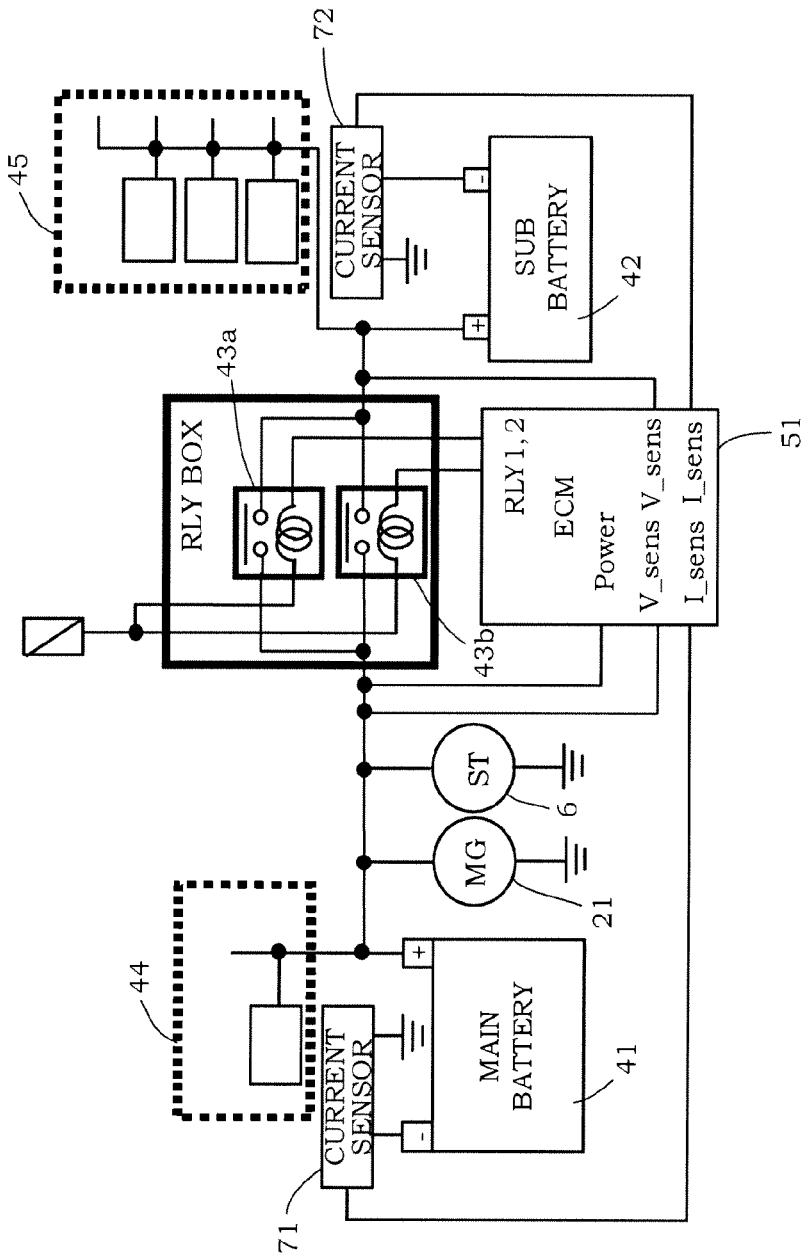
FIG. 3 is a detailed circuit configuration view in which a main battery, a sub battery, a relay, and an engine control module are included.

FIG. 3 is a detailed circuit configuration view in which the main battery 41, the sub battery 42, the relays 43*a* and 43*b*, and the engine control module 51 are included. The engine control module 51 detects a voltage of the main battery 41 and a voltage of the sub battery 42. The engine control module 51 also reads out a charged/discharged current of the main battery 41 detected by a current sensor 71 and a charged/discharged current of the sub battery 42 detected by a current sensor 72. Then, the engine control module 51 calculates an SOC (State of Charge) of the main battery 41 on the basis of the charged/discharged current of the main battery 41 thus read out, and manages a balance of charging/discharging of the main battery 41 on the basis of this SOC. The engine control module 51 also calculates an SOC of the sub battery 42 on the basis of the charged/discharged current of the sub battery 42, and manages a balance of the charging/discharging of the sub battery 42.

The engine control module 51 alternately turns on any one of the relays 43*a* and 43*b* when the relays 43*a* and 43*b* are turned on in a normal time when an on-fixation failure, in which the relays 43*a* and 43*b* continue to be turned on, or an off-fixation failure, in which the relays 43*a* and 43*b* continue to be turned off, does not occur. This makes it possible to consume the relays 43*a* and 43*b* uniformly, and it is possible to extend the number of times of durable operations compared with a case where only one relay is provided.

In the control device for the vehicle according to the embodiment, in a case where the on-fixation failure of any one of the two relays 43*a* and 43*b* provided between the main battery 41 and the sub battery 42 occurs, power operation of the motor generator 21 is prohibited. In a case where the power operation of the motor generator 21 is carried out when the on-fixation failure of the relay occurs, there is a probability that a voltage drop of the sub battery 42 occurs and power supply shortage from the sub battery 42 to the electric load 45 thereby occurs. However, by prohibiting the power operation of the motor generator 21 when the on-fixation failure of the relay occurs, it is possible to prevent the power supply shortage from the sub battery 42 to the electric load 45 from occurring.

Figure 4:
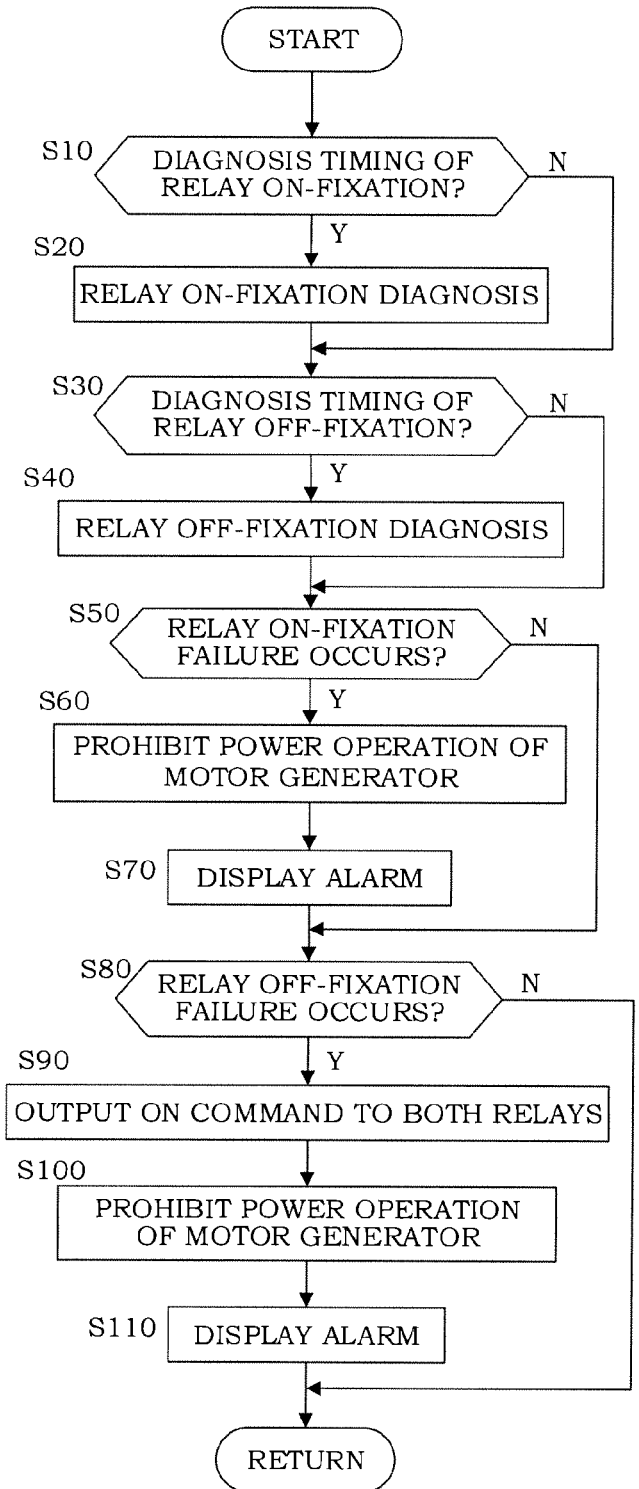
FIG. 4 is a flowchart illustrating the control content in a case where an on-fixation failure or an off-fixation failure of the relay occurs.

FIG. 4 is a flowchart illustrating the control content in a case where an on-fixation failure or an off-fixation failure of the relays 43*a* and 43*b* occurs. When the vehicle is started, the engine control module 51 starts a process at Step S10 in a predetermined cycle.

At Step S10, it is determined whether it is diagnosis timing of relay on-fixation or not. In the present embodiment, the relay on-fixation diagnosis is carried out at the time of initial start of the engine 2, at the time of engine restart after the idle stop, and at the time of torque assist by the motor generator 21. Namely, the relay on-fixation diagnosis is carried out at timing when a command to turn off both the relays 43*a* and 43*b* has been outputted and the starter 6 or the motor generator 21 is to be operated.

Figure 5:
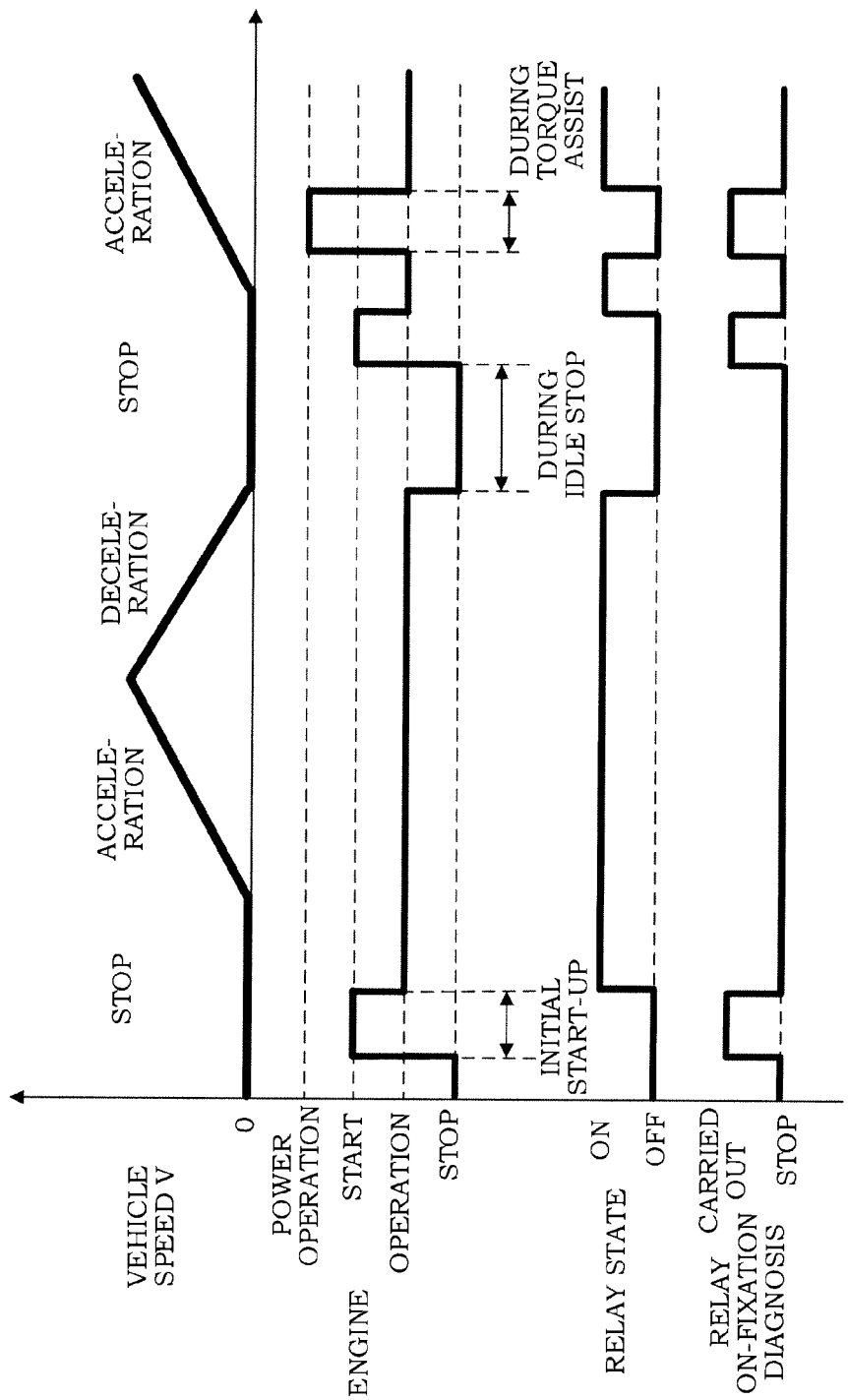
FIG. 5 is a view illustrating diagnosis timing of relay-on fixation.

FIG. 5 is a view illustrating the diagnosis timing of relay on-fixation. FIG. 5 shows a vehicle speed V, a state of the engine 2, a state of the relays 43*a* and 43*b*, and a state of the relay on-fixation diagnosis from the upside thereof.

At the time of initial start of the engine 2, both the relays 43*a* and 43*b* are turned off, and the starter 6 is operated to start the engine 2. At the time of restart of the engine after the idle stop, both the relays 43*a* and 43*b* are turned off, and the motor generator 21 is operated to start the engine 2. At the time of torque assist by the motor generator 21, both the relays 43*a* and 43*b* are turned off, and the torque assist is carried out by driving the motor generator 21. In any case, in a case where both the relays 43*a* and 43*b* are turned off, electric power is supplied from the main battery 41 to the starter 6 or the motor generator 21. For this reason, an instantaneous voltage drop of the sub battery 42 should not occur. Therefore, in a case where the instantaneous voltage drop of the sub battery 42 occurs at any of these timings, it is possible to determine that the on-fixation failure occurs at least one of the two relays 43*a* and 43*b*.

In a case where it is determined at Step S10 that it is not the diagnosis timing of relay on-fixation, the processing proceeds to Step S30. In a case where it is determined that it is the diagnosis timing of relay on-fixation, the processing proceeds to Step S20.

At Step S20, the relay on-fixation diagnosis is carried out. Here, in a case where a condition (c) is satisfied in a state that conditions (a) and (b) mentioned below are satisfied, it is determined that the on-fixation failure occurs at least one of the two relays 43*a* and 43*b*:

(a) A command to turn off the two relays 43*a* and 43*b* has been outputted;

(b) The power steering and the vehicle dynamic control are not operated; and (c) A predetermined period of time (100 msec., for example) has elapsed in a state in which the voltage of the sub battery 42 is a predetermined voltage (11.2V, for example) or lower and a discharge current flows from the sub battery 42.

In this regard, the method of the relay on-fixation diagnosis is not limited to the method described above.

At Step S30, it is determined whether it is the diagnosis timing of relay off-fixation or not. In the present embodiment, the relay off-fixation diagnosis is carried out when a command to turn on any one of the relays 43*a* and 43*b* has been outputted.

Figure 6:
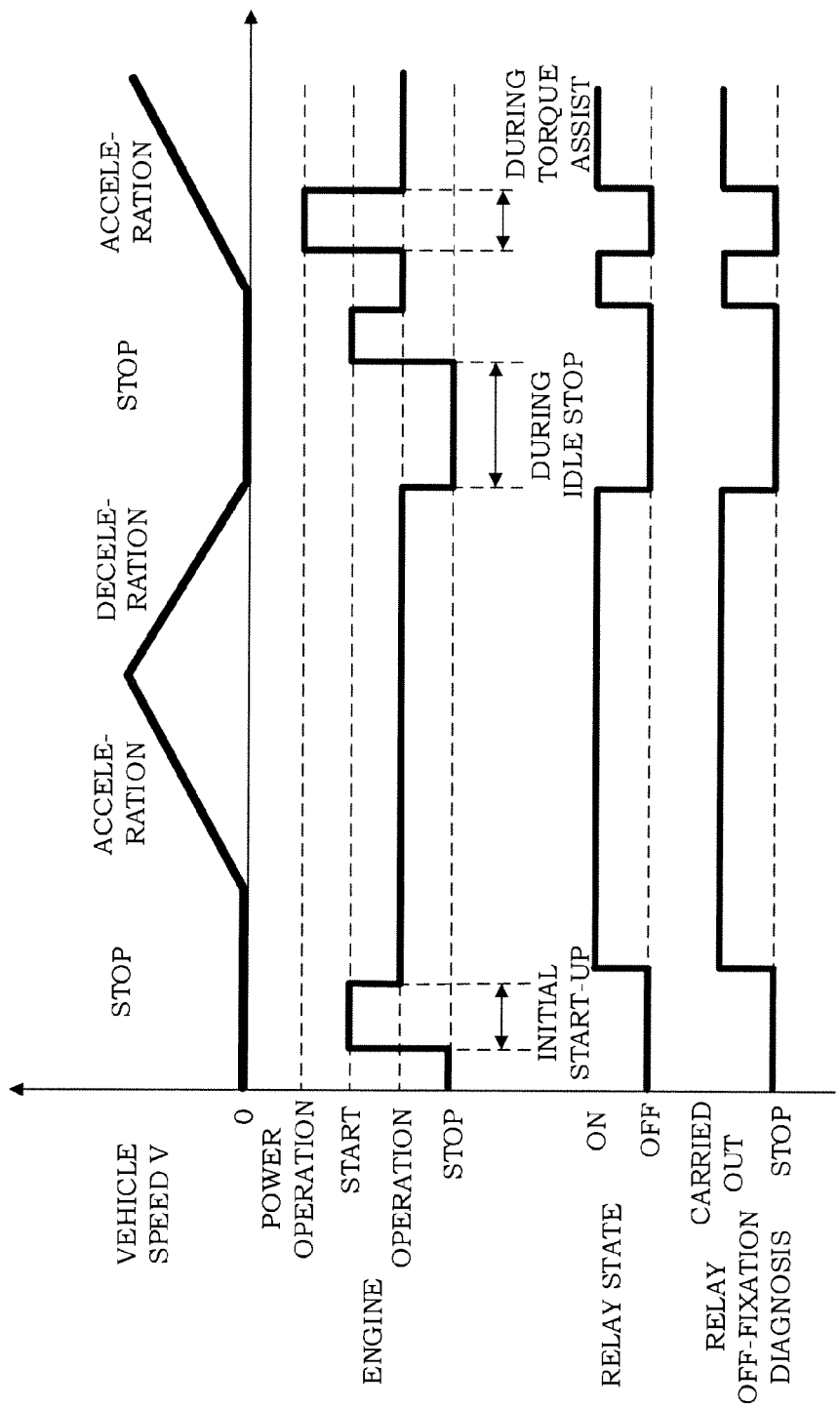
FIG. 6 is a view illustrating diagnosis timing of relay-off fixation.

FIG. 6 is a view illustrating the diagnosis timing of relay off-fixation. FIG. 6 shows the vehicle speed V, the state of the engine 2, the state of the relays 43*a* and 43*b*, and a state of relay off-fixation diagnosis from the upside thereof. As shown in FIG. 6, the relay off-fixation diagnosis is carried out when the relays 43*a* and 43*b* are turned on, such as at the time of stop after the initial start of the engine 2, at the time of acceleration or deceleration of the vehicle, after restart from the idle stop and the like.

When a command to turn on any one of the relays 43*a* and 43*b* is outputted, a charge current can be supplied to the main battery 41 and the sub battery 42 to charge the main battery 41 and the sub battery 42 by means of the regenerative operation of the motor generator 21. As a result, it is possible to control the main battery 41 and the sub battery 42 so that a voltage difference between the main battery 41 and the sub battery 42 is kept within a predetermined voltage. However, in a case where the off-fixation failure occurs in the relay, to which the on command has been outputted, at this time, the sub battery 42 cannot be charged, only discharge of the sub battery 42 is carried out. The voltage thereof keeps on lowering, and the voltage difference between the main battery 41 and the sub battery 42 thereby expands. On the basis of these facts, the relay off-fixation failure is diagnosed.

In a case where it is determined at Step S30 that it is not the diagnosis timing of relay off-fixation, the processing proceeds to Step S50. In a case where it is determined at Step S30 that it is the diagnosis timing of relay off-fixation, the processing proceeds to Step S40.

At Step S40, the relay off-fixation diagnosis is carried out. Here, in a case where a condition (e) or (f) is satisfied in a state that a condition (d) mentioned below is satisfied, it is determined that the off-fixation failure occurs in one of the relays 43*a* and 43*b* to which the on command has been outputted:

(d) The ignition switch is turned on;

(e) A first predetermined period of time (25.5 sec., for example) has elapsed in a state that the voltage difference between the main battery 41 and the sub battery 42 is a first predetermined voltage (1.04V, for example) or higher and a discharge current flows from the sub battery 42; and (f) A second predetermined period of time (100 msec., for example) shorter than the first predetermined period of time has elapsed in a state that the voltage difference between the main battery 41 and the sub battery 42 is a second predetermined voltage (1.44V, for example) or higher, which is higher than the first predetermined voltage, and a discharge current flows from the sub battery 42.

The conditions (e) and (f) described above can be set up by considering a drop in an assist force of an electric power steering, inoperability of the vehicle dynamic control (motor), stop of the assist force of the electric power steering, stop of an operation of a solenoid valve in a CVT, inoperability of the vehicle dynamic control (actuator) and the like, which may occur at the time of the relay off-fixation failure. However, the method of the relay off-fixation diagnosis is not limited to the method described above.

At Step S50, it is determined whether the relay on-fixation failure has occurred or not. In a case where the relay on-fixation diagnosis is carried out at Step S20 and it is diagnosed that the relay on-fixation failure has occurred, the processing proceeds to Step S60. On the other hand, in a case where the relay on-fixation diagnosis is not carried out at Step S20 or it is diagnosed that the relay on-fixation failure has not occurred in spite that the relay on-fixation diagnosis has been carried out, the processing proceeds to Step S80.

At Step S60, power operation of the motor generator 21 is prohibited. More specifically, controls of the torque assist by the motor generator 21, idle stop, coast stop for automatically stopping the engine 2 during traveling of the vehicle and the like are prohibited. Prohibiting of the idle stop and the coast stop is because the engine 2 is restarted using the motor generator 21 at the time of return from the idle stop or at the time of return from the coast stop.

At Step S70, by outputting an alarm display on the combination meter 66, a driver is notified of occurrence of a failure. In this regard, in order to notify the driver of the occurrence of a failure, an alarm may be displayed at a location other than the combination meter 66 or a warning sound may be made from a speaker, which is not shown in the drawings.

At Step S80, it is determined whether the relay off-fixation failure has occurred or not. In a case where the relay off-fixation diagnosis is carried out at Step S40 and it is diagnosed that the relay off-fixation failure has occurred, the processing proceeds to Step S90. On the other hand, in a case where the relay off-fixation diagnosis is not carried out at Step S40 or it is diagnosed that the relay off-fixation failure has not occurred in spite that the relay off-fixation diagnosis has been carried out, the processing of the flowchart is terminated.

At Step S90, an on command is also outputted to the other relay of the relays 43*a* and 43*b*, that is, the relay to which the on command has not been outputted, and the on command is thereby outputted to both the relays 43*a* and 43*b*. As a result, since the other relay of the relays 43*a* and 43*b* is turned on, and the motor generator 21 and the sub battery 42 can be connected to each other. For this reason, the sub battery 42 can be charged by the regenerative operation of the motor generator 21, and it is possible to prevent the voltage of the sub battery 42 from keeping on lowering so that electric power cannot be supplied to the electric load 45.

At Step S100, the power operation of the motor generator 21 is prohibited. More specifically, controls of the torque assist by the motor generator 21, idle stop, coast stop for automatically stopping the engine 2 during traveling of the vehicle and the like are prohibited.

At Step S110, by outputting an alarm display on the combination meter 66, a driver is notified of occurrence of a failure. In this regard, in order to notify the driver of the occurrence of a failure, an alarm may be displayed at a location other than the combination meter 66 or a warning sound may be made from a speaker, which is not shown in the drawings.

As described above, the control device for the vehicle according to one embodiment includes: the motor generator 21 mechanically connected to the output shaft of the engine 2; the main battery 41 electrically connected to the motor generator 21, the sub battery 42 electrically connected to the electric load 45 of the vehicle, and the relays 43*a* and 43*b* adapted to switch whether the main battery 41 and the sub battery 42 are to be electrically connected or not by turning on/off the relays 43*a* and 43*b* themselves. In this control device for the vehicle, during the power operation of the motor generator 21, electric connection between the main battery 41 and the sub battery 42 is disconnected by turning off the relays 43*a* and 43*b*. Further, during the regenerative operation of the motor generator 21, the main battery 41 and the sub battery 42 are electrically connected by turning on the relay 43a or 43b. Then, in a case where the on-fixation failure of the relay 43a or 43b is detected, the power operation of the motor generator 21 is prohibited. This makes it possible to prevent a voltage drop of the sub battery 42, and it is possible to prevent occurrence of power supply shortage from the sub battery 42 to the electric load 45.

Further, in a case where the off-fixation failure of the relays 43a and 43b connected in parallel is detected, the relay in which the off-fixation failure is not detected is turned on, and the power operation of the motor generator 21 is prohibited. As a result, since the motor generator 21 and the sub battery 42 can be connected to each other, it is possible to charge the sub battery 42 by the regenerative operation of the motor generator 21, and this makes it possible to prevent the voltage of the sub battery 42 from keeping on lowering and to prevent inability of power supply to the electric load 45.

Particularly, according to the control device for the vehicle in one embodiment, the off-fixation failure is detected on the basis of the voltage difference between the main battery 41 and the sub battery 42 in a state that the command to turn on the relay 43a or 43b is outputted. In a case where the off-fixation failure occurs in the relay to which the on command has been outputted, the sub battery 42 cannot be charged, only discharge of the sub battery 42 is carried out. The voltage keeps on lowering, and the voltage difference between the main battery 41 and the sub battery 42 thereby expands. For this reason, it is possible to detect the off-fixation failure reliably.

Further, the on-fixation failure is detected on the basis of the state of the sub battery 42 in the state that the command to turn off the relays 43a and 43b is outputted. In a case where the starter 6 or the motor generator 21 is driven, for example, in the state that the command to turn off the relays 43a and 43b is outputted, electric power is supplied from the main battery 41 to the starter 6 or the motor generator 21 as long as both the relays 43a and 43b are turned off. For this reason, an instantaneous voltage drop should not occur in the sub battery 42. However, in a case where the on-fixation failure has occurred, the instantaneous voltage drop occurs in the sub battery 42. Therefore, it is possible to detect the on-fixation failure reliably.

The present invention is not limited to the embodiment described above (first embodiment), and various variations and applications can be made within a range not departing from the gist of the present invention.

When the relay off-fixation occurs (when the determination at Step S80 in FIG. 4 is affirmative), the on command is also outputted to the other relay of the relays 43a and 43b at Step S90 in FIG. 4, whereby the on command is outputted to both the relays 43a and 43b. However, the present invention is not limited to this. For example, it may be configured so that the on command is outputted to the other relay of the relays 43a and 43b and the off command is outputted to the one relay (second embodiment).

Further, in the embodiment described above, when the determination at Step S80 in FIG. 4 is affirmative, the on command is outputted at Step S90 on the premise that the other relay of the relays 43a and 43b is normal. However, the present invention is not limited to this. It may be configured so that when the determination at Step S80 in FIG. 4 is affirmative, it is determined whether the other relay is normal or not. In a case where it is determined that the other relay is normal, the on command may be outputted to the other relay (third embodiment).

In this regard, the relays 43a and 43b may be either electric relays (semiconductor switches) or mechanical relays (mechanical contacts driven by an electromagnet). The semiconductor switch is allowed to have a self-diagnosis function. For this reason, in a case where the third embodiment described above is to be put into practice, it is possible to realize the third embodiment by using a semiconductor switch, to which the self-diagnosis function is added, as a relay.

The present application claims priority to Japanese Patent Application No. 2012-167009 filed with Japan Patent Office on Jul. 27, 2012, the content of which is incorporated herein by reference in their entirety.

The invention claimed is:

1. A control device for a vehicle, comprising:
   a motor generator mechanically connected to an output shaft of an engine;
   a first battery electrically connected to the motor generator;
   a second battery electrically connected to an electric load of the vehicle;
   first and second relays adapted to respectively switch to cause the first battery and the second battery to be electrically connected or not, by turning the respective relay on or off; and
   a controller electrically connected to each of the motor generator, the first and second batteries, and the first and second relays, and configured to cause the motor generator to carry out a power operation or a regenerative operation in accordance with an operation state of the vehicle,
   wherein the controller is configured to:
   turn off the first and second relays during the power operation of the motor generator so as to disconnect an electric connection between the first battery and the second battery, and
   turn on one relay of the first and second relays during the regenerative operation of the motor generator so as to electrically connect the first battery and the second battery,
   wherein the controller is configured to detect an on-fixation failure in which the relay is fixed in an on state on the basis of a state of the second battery when a command to turn off the first relay and the second relay is outputted by the controller, and
   wherein the controller is configured to prohibit the power operation of the motor generator in a case where the on-fixation failure of any of the first and the second relays is detected.

2. The control device for the vehicle according to claim 1, wherein
   the controller is configured to detect an off-fixation failure in which the first relay or the second relay is fixed in an off state on the basis of a voltage difference between the first battery and the second battery when a command to turn on the first relay or second relay is outputted by the controller,
   wherein the controller is configured to turn on one relay of the first relay and the second relay in which an off-fixation failure has not been detected in a case where the off-fixation failure is detected in any one of the first relay and the second relay, and
   wherein the controller is configured to prohibit the power operation of the motor generator in a case where the off-fixation failure of any of the first and the second relays is detected.

3. The control device according to claim 1,
   wherein the controller is configured to determine that the on-fixation failure occurs in a case where a condition (i) is satisfied when a power steering and a vehicle dynamic control are not operated:

(i) a predetermined period of time has elapsed in a state in which the voltage of the second battery is a predetermined voltage or lower and a discharge current flows from the second battery.

4. The control device according to claim 2, wherein the controller is configured to determine that the off-fixation failure occurs in a case where a condition (ii) or (iii) is satisfied:

(ii) a first predetermined period of time has elapsed in a state that the voltage difference between the first battery and the second battery is a first predetermined voltage or higher and a discharge current flows from the second battery;

(iii) a second predetermined period of time shorter than the first predetermined period of time has elapsed in a state that the voltage difference between the first battery and the second battery is a second predetermined voltage or higher and a discharge current flows from the second battery, the second predetermined voltage being higher than the first predetermined voltage.

5. A method of controlling a vehicle, the vehicle comprising:

a motor generator mechanically connected to an output shaft of an engine;

a first battery electrically connected to the motor generator;

a second battery electrically connected to an electric load of the vehicle; and first and second relays adapted to respectively switch to cause the first battery and the second battery to be electrically connected or not by turning the corresponding relay on or off, wherein the method comprises:

turning off the first and second relays during power operation of the motor generator so as to disconnect an electric connection between the first battery and the second battery, and turning on one relay of the first and second relays during regenerative operation of the motor generator so as to electrically connect the first battery and the second battery;

detecting an on-fixation failure in which the relay is fixed in an on state on the basis of a state of the second battery when a command to turn off the first relay and the second relay is outputted; and prohibiting the power operation of the motor generator in a case where the on-fixation failure of any of the first and the second relays is detected.

6. The method according to claim 5, further comprising:

detecting an off-fixation failure in which the first relay or the second relay is fixed in an off state on the basis of a voltage difference between the first battery and the second battery when a command to turn on the first relay or second relay is outputted;

turning on one relay of the first relay and the second relay in which an off-fixation failure has not been detected in a case where the off-fixation failure is detected in any one of the first relay and the second relay; and prohibiting the power operation of the motor generator in a case where the off-fixation failure of any of the first and the second relays is detected.

* * * * *